(12) United States Patent
Hartmann et al.

(10) Patent No.: US 7,103,948 B1
(45) Date of Patent: Sep. 12, 2006

(54) METHOD OF MANUFACTURING PIEZOELECTRIC WAFERS OF SAW IDENTIFICATION TAGS

(75) Inventors: Clinton S. Hartmann, Dallas, TX (US); Paul S. Brown, Garland, TX (US)

(73) Assignee: RF Saw Components, Inc., Richardson, TX (US)

( * ) Notice: Subject to any disclaimer, the term of this patent is extended or adjusted under 35 U.S.C. 154(b) by 506 days.

(21) Appl. No.: 10/059,700

(22) Filed: Jan. 28, 2002

(51) Int. Cl.
*H04R 17/00* (2006.01)
(52) U.S. Cl. .................... 29/25.35; 29/592.1; 29/594; 29/609.1; 181/171; 181/172; 310/313 B; 310/313 R; 361/396; 361/398; 235/454; 235/455; 235/492
(58) Field of Classification Search ............... 29/25.35, 29/594, 609.1; 310/313 B, 313 R; 361/396, 361/398; 181/171, 172; 235/454, 455, 492
See application file for complete search history.

(56) References Cited

U.S. PATENT DOCUMENTS

| | | | |
|---|---|---|---|
| 4,399,441 A * | 8/1983 | Vaughan et al. | 342/50 |
| 4,625,207 A | 11/1986 | Skeie | |
| 5,359,250 A * | 10/1994 | Toda | 310/313 R |
| 6,121,892 A * | 9/2000 | Reindl et al. | 340/5.8 |
| 6,806,808 B1 * | 10/2004 | Watters et al. | 340/10.41 |

FOREIGN PATENT DOCUMENTS

| | | | |
|---|---|---|---|
| DE | 19622154 A1 * | 5/1997 | |
| GB | 2 238 210 A | 5/1991 | |

OTHER PUBLICATIONS

"Programmable reflectors for SAW-ID-tags"; Reindl, L.; Ruile, W.; Ultrasonics Synposium, 1993. Proceedings., IEEE 1993; Oct. 31-Nov. 3, 1993 pp.: 125-130 vol. 1.*
"Design, Fabrication, and Application of GHz SAW Devices" by Ulrich Knauer, et al.; 1997 IEEE; pp. 1821-1030.
"Chipspurnasen fur Logistic" by E. Heinzelmann; Technische Rundschau, Online! No. 14; 1997; pp. 44-48.
"An Active Tagging System Using Circular Polarization Modulation" by Marcel Kossel, et al.; 1999 IEEE; pp. 1595-1598.
"A Global SAW ID Tag with Large Data Capacity" by Clinton S. Hartmann; 2002 IEEE Ultrasonics Symposium; pp. 65-69.

* cited by examiner

*Primary Examiner*—Paul D. Kim (57) ABSTRACT

The invention provides a method of manufacturing piezoelectric wafers of surface acoustic wave (SAW) identification tags. In one embodiment, the method includes: (1) using a master reticle to form, on each of the piezoelectric wafers, wafer-independent patterns that encode digits of a first significance for SAW identification tags; and (2) using different ones of a library of coding reticles to form, on each of the piezoelectric wafers, wafer-dependent patterns that encode digits of a second significance for SAW identification tags.

8 Claims, 6 Drawing Sheets

METHOD OF MANUFACTURING PIEZOELECTRIC WAFERS OF SAW IDENTIFICATION TAGS

TECHNICAL FIELD OF THE INVENTION

The present invention is directed, in general, to a method of manufacturing identification tags and, more specifically, to a method of manufacturing a surface acoustic wave (SAW) identification tag having enhanced data content.

BACKGROUND OF THE INVENTION

A fascinating and increasingly important technology is that dealing with object identification systems. Such systems range from simple bar codes to very sophisticated systems still in the process of development and implementation. Among the most promising object identification systems are those using electronic tags attached to or associated with objects. Such tags respond to an electronically generated interrogation signal by providing a return signal containing a numeric or alpha-numeric identification code identifying the object to which it is attached or with which it is associated.

One such identification system is based on attaching or associating a radio frequency identification ("RFID") tag with an object. As the name implies, when interrogated by a radio frequency signal, the RFID tag reflects or retransmits the signal to provide a code that identifies the object. RFID tags are of two basic types; those that contain a microchip and those that do not. The difference in cost and performance between the two types is so radical that the two categories rarely compete with one another for a particular type of use.

Chip tags are by far the most extensively used. A chip tag consists of four elements or features: (1) a computer microchip; (2) circuits for converting radio signals to computer data signals and back to radio signals; (3) an antenna; and (4) a means for providing DC power to the chip circuitry. In low cost RFID chip tags, the first two features are often partially or totally integrated into a single microchip, which integration requires certain compromises in tag performance (read range, number of bits, etc.). This combination of features also leads to certain integrated circuit (IC) cost and/or design compromises to accommodate both digital and radio frequency circuitry on a single IC. The impact of these design compromises can be partially compensated for by use of low radio frequency (RF) operating frequencies that, in turn, lead to rather large and expensive antennas.

The most daunting problem with chip tags is the need for DC power for the chip circuitry. The combination of environmental issues coupled with severe constraints on cost, size and weight usually requires that the tag not have a battery or other on-board power source. The only generally useable solution is to obtain DC power by converting RF power received from the tag reader signal into DC power within the tag. Those skilled in the pertinent art term tags without a battery or other power source as "passive" tags, while those that contain a battery or other source are termed as "active" tags. The passive method of providing DC power to a chip tag requires a more efficient tag antenna (i.e., larger size and cost) and higher transmitted power levels from the reader. It also requires added components which will either add to the cost of the microchip or to the cost of the tag for the required extra electrical components in the tag, which will also result in an increased tag size. The most important limitation of passive powered chip tags, however, is the severe restriction on the read range of the tag because a signal that is sufficiently strong to power the tag only extends a short distance from the tag reader antenna.

"Chipless" RFID tags do not contain a microchip but, instead, rely on magnetic materials or transistorless thin film circuits to store data. A major advantage of chipless RFID tags is their relatively low cost. The disadvantages of chipless tags include that they are range limited (several centimeters at the most) and only contain limited amounts of information. The severity of these problems has prevented their market acceptance in spite of their low cost potential.

In the year 2000, the global market for conventional RFID systems and services was in the order of 500 million U.S. dollars. This market was largely for chip tags that typically cost from about one dollar to tens of dollars each. While chipless tags are not selling well, they have generated great interest from a number of potential users because of their low cost potential. A huge gap exists in the automatic identification market between the very low cost bar codes and the higher performing RFID chip tags. The overall market is clamoring for a technical solution to fill that gap.

The critical characteristics of any new automatic identification technology designed to fill this gap are: (1) a cost of between one cent and ten cents per tag when manufactured in high quantities; (2) reliable reading without the need for manual scanning by a human operator; (3) reliable reading without a line of sight between the tag and tag reader (i.e., reliable reading even if the tag is scratched, or covered with dirt, or on the wrong side of the package, etc.); (4) a reliable read range of at least one to two meters; and (5) a tag data capacity of roughly 100 bits. Such tags are of vital interest to postal authorities, airlines and airports, mass transit authorities, animal breeders, the livestock industry, delivery businesses, any business with significant supply chains, particularly those that maintain inventory or handle fast moving consumer goods, and so on. These are all applications where a high priced tag is not practicable, particularly where the tag is disposable or is going to be sold with the product.

To address and overcome the existing limitations in RFID tags of cost, data capacity and reliable range, a new type of RFID tag technology has been developed. This new technology is described in detail in U.S. patent application Ser. No. 10/024,624, entitled "Surface Acoustic Wave Identification Tag Having Enhanced Data Content and Methods of Operation and Manufacture Thereof," by Hartmann, commonly assigned with the invention and incorporated herein by reference. To take advantage of this promising new technology, it is imperative to economically manufacture the RFID tags described by Hartmann.

Accordingly, what is needed in the art is a method to economically manufacture identification tags having an enhanced data storage capacity.

SUMMARY OF THE INVENTION

To address the above-discussed deficiencies of the prior art, the present invention provides a method of manufacturing piezoelectric wafers of surface acoustic wave (SAW) identification tags. In one embodiment of the invention, the method includes: (1) using a master reticle to form, on each of the piezoelectric wafers, wafer-independent patterns that encode digits of a first significance for SAW identification tags; and (2) using different ones of a library of coding reticles to form, on each of the piezoelectric wafers, wafer-dependent patterns that encode digits of a second significance for SAW identification tags.

The present invention, therefore, introduces the broad concept of manufacturing piezoelectric wafers of SAW identification tags that employ both phase and pulse position modulation whereby the amount of data that can be encoded on each SAW identification tag is dramatically increased. Such increased data capacity allows tags to contain, e.g., globally unique numbers, which feature permits SAW identification tags to be used for identifying and tracking an unprecedented number of objects uniquely and reliably.

In one embodiment of the invention, the method includes: (1) using a master reticle or mask on a stepper to form, in multiple fields across each of the piezoelectric wafers, wafer-independent patterns that encode digits of a first significance for SAW identification tags; and (2) using different ones of a library of coding reticles or masks on a stepper to form, in multiple fields across each of the piezoelectric wafers, wafer-dependent patterns that encode digits of a second significance for SAW identification tags. In another embodiment a programmable stepper is used.

In still another embodiment of the invention the method includes: (1) establishing wafer-dependent indices for each of the piezoelectric wafers; (2) using a reticle on a stepper to form, in multiple fields across each of the piezoelectric wafers, wafer-independent patterns that encode digits of a first significance for the SAW identification tags; and (3) causing the reticle to follow the wafer-dependent indices and thereby form, in multiple fields across each of the piezoelectric wafers, wafer-dependent patterns that encode digits of a second significance for the SAW identification tags. In one aspect of this embodiment, a one power reticle is used.

Yet still another embodiment of the invention further comprises forming a SAW transducer for each of the SAW identification tags. Another aspect of the invention provides for forming wafer-independent and wafer-dependent patterns by forming reflectors distributed among a group of slots arranged by both pulse position and phase position, with the reflectors encoding the digits of a first significance and the digits of a second significance.

In another embodiment the method provides forming reflector of structures that reflect surface acoustic waves. In still another embodiment, the method provides for forming a framing reflector on the SAW identification tags between the SAW transducer and the group of slots.

In still another embodiment of the invention the method provides for forming a plurality of groups separated by dead spaces. Another aspect of this embodiment provides that the plurality of groups of slots is at least twelve although any number of groups of slots is within the intended scope of the present invention.

In one embodiment of the invention the method provides for at least some of the reflectors to be single strips of conductive metal. In a particularly useful embodiment, the method provides for forming an end reflector on the SAW identification tags. In an embodiment to be illustrated and described, the framing reflector and end reflector serve to frame a return signal.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
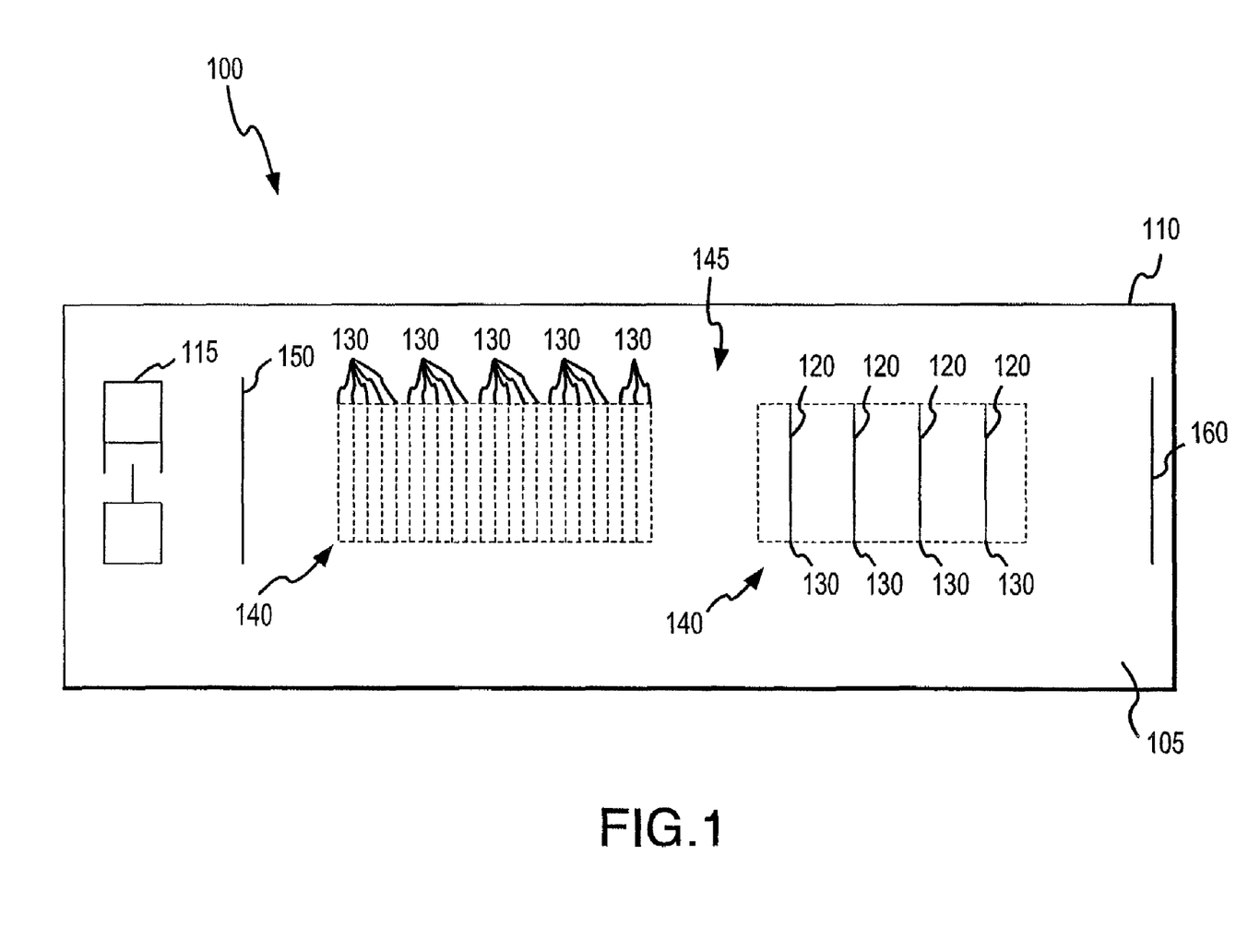
FIG. 1 illustrates a plan view of a surface of an embodiment of a SAW identification tag representative of those formed on piezoelectric wafers manufactured in accordance with the present invention.

Referring initially to FIG. 1, illustrated is a plan view of a top surface 105 of a substrate 110 of an embodiment of a SAW identification tag 100 representative of those formed on piezoelectric wafers manufactured in accordance with the present invention. A description of the illustrated SAW identification tag 100 is presented to provide assistance in understanding the use of silicon or micro-electronic processing techniques to manufacture piezoelectric wafers of SAW identification tags 100. For a detailed explanation of SAW identification tags 100 of the type illustrated see U.S. patent application Ser. No. 10/024,624, entitled "Surface Acoustic Wave Identification Tag Having Enhanced Data Content and Methods of Operation And Manufacture Thereof," by Hartmann, commonly assigned with the invention and incorporated herein by reference.

Located at one end of the surface 105 of the SAW identification tag 100 is a transducer 115. As those of ordinary skill in the pertinent art will recognize, the transducer 115 may be located in other positions on the surface 105 and still be within the intended scope of the present invention. When the transducer 115 is electrically connected to a means for obtaining an interrogation signal from a SAW identification tag reader (e.g. via an antenna), a signal having a known frequency and amplitude is generated that travels down the substrate 110 as a surface acoustic wave or SAW. For a detailed description of a SAW identification tag reader see U.S. Pat. No. 6,708,881 B2 to Hartmann, entitled "Reader For a High Information Capacity Saw Identification Tag and Method of Use Thereof," by Hartmann, commonly assigned with the invention and incorporated herein by reference.

Located on the surface 105 of the substrate 110 are a number of encoding reflectors 120 designed to reflect a portion of the SAW back to the transducer 115. The reflectors 120 are arranged to encode the reflected response with an identification number that can be decoded or demodulated. The reflectors 120 may be any one of a number of structures that reflect a SAW, such as, without being limited to, etched grooves, nonconductive barriers, or a conductive material. The reflectors 120 could, alternatively, be multiple strips of conductive material coupled together to act as a single reflector 120, as well as a conductive material used in conjunction with a nonconductive structure, such as an etched groove. All of these configurations are within the intended scope of the present invention.

When a SAW signal is generated, it proceeds along the length of the substrate 110 until it encounters a reflector 120 that reflects a portion of the signal. The unreflected portion of the SAW signal continues along the substrate 115 and generates additional reflected signals from all succeeding reflectors 120 to create the complete modulated reflected response unique to that SAW identification tag 100. The transducer 115 converts this complete modulated reflected response back to an electrical signal that is returned to the reader by a suitable means (e.g. an antenna). This response is then decoded or demodulated to reveal the specific SAW identification tag 100 number.

The modulated return signal is generated by locating the reflectors 120 on the surface 105 in a group 140 of slots 130 arranged by both pulse position and phase position with the number of slots 130 dependent on the encoding system being used. In one embodiment, for example, the slots 130 can be arranged in phase quadrature to correspond to a +I, a +Q, a −I and a −Q phase of a SAW return signal. In other embodiments, different phase positions may be used, which different phase positions would require slots 130 to be arranged accordingly. Of course any number of phase positions and any number of slots 130 are well within the intended scope of the present invention. Because each slot 130 is located at a predetermined pulse position and phase position relative to the transducer 115, a skip factor is often enforced between actual reflectors 120 to minimize intersymbol interference.

Another feature that assists in isolating the signal to enable it to be more readily identified for decoding purposes is a framing reflector 150 located between the SAW transducer 115 and a group 140. This framing reflector 150 can be regarded as a starting point set at a specified distance from the transducer 115 to identify the point in the reflected signal where decoding or demodulating of the signal is to commence. In another embodiment, an end reflector 160 is also located on the surface 105 and, together with the framing reflector 150, can serve to frame the entire reflected signal encoding the SAW identification tag 100 number. Of course additional framing 150 or end 160 reflectors can be provided to improve signal identity and be within the scope of the intended invention.

A number of different configurations of groups 140, slots 130 and reflectors 120 can be used on SAW identification tags, all of which will be within the intended scope of the present invention. In some embodiments a spacer 145 will be located between groups to assist in the control of intersymbol interference. In one embodiment of a SAW identification tag 100, for example, quadrature encoding is used to encode a number in a group 140 of slots 130 where the number is eight bits long. Eight bits is sufficient to permit the encoding of hexadecimal numbers from 00 to FF for an aggregate of 256 different numbers. Of course, even longer numbers can be encoded within a single group 140 and more than one group 140 can be located on a SAW identification tag 100, all of which will be well within the intended scope of the present invention as those of ordinary skill in the pertinent art will understand.

Figure 2A:
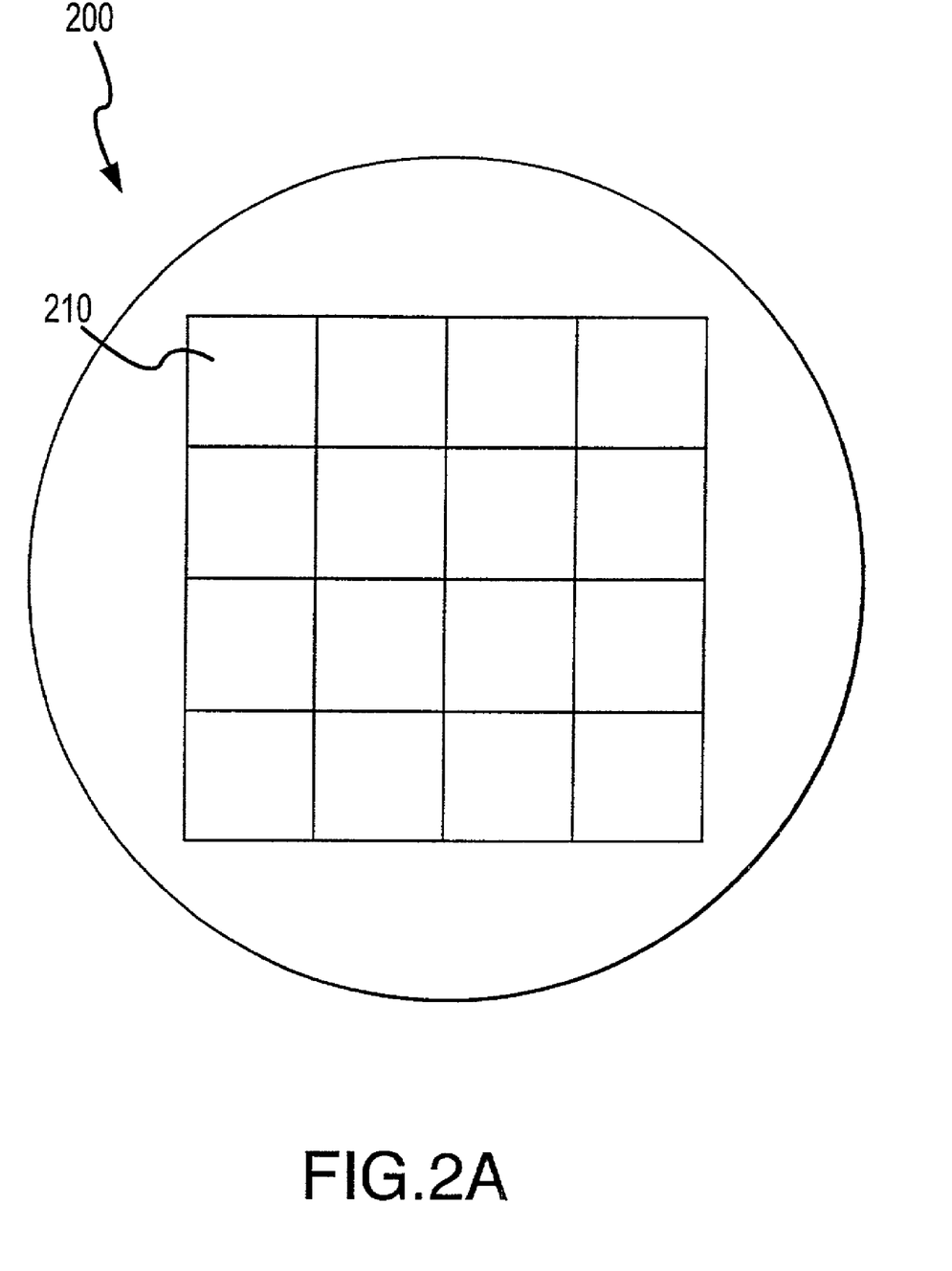
FIGS. 2A and 2B illustrate a layout of an embodiment of a piezoelectric wafer manufactured in accordance with the present invention showing arrays of SAW identification tags together with a representative embodiment illustrating one such tag.
Figure 2B:
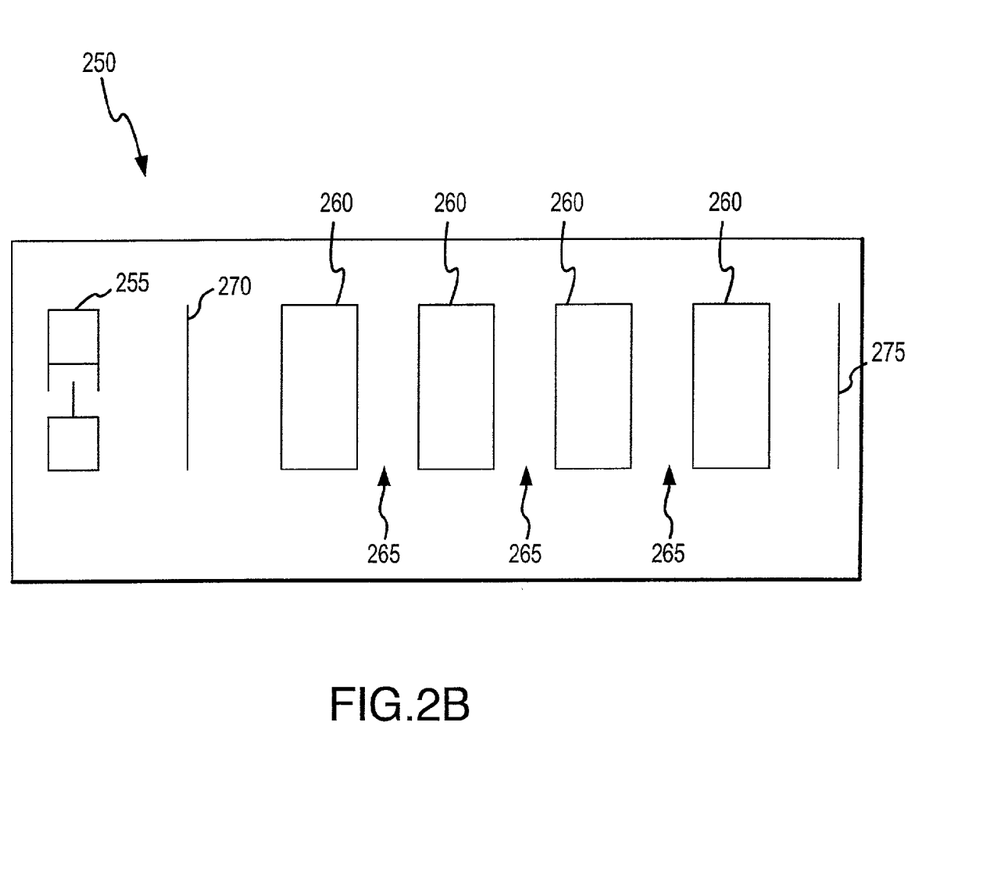

Turning now to FIGS. 2A and 2B, illustrated is a layout of an embodiment of a piezoelectric wafer 200 manufactured in accordance with the present invention showing arrays 210 of SAW identification tags 250 together with a representative embodiment illustrating one such tag 250. A single piezoelectric wafer 200 can be used to manufacture a number of SAW identification tags 250. The actual number that can be made on a single wafer 200 is determined by the amount of wafer 200 space required for each tag 250, which amount is largely dependent on the transducer frequency and the number of digits to be encoded.

In one embodiment of the invention, the method provides for SAW transducers 255 that are responsive to a frequency of between two and three gigahertz. A particularly useful aspect of this embodiment provides for a SAW transducer 255 responsive to a frequency of 2.45 GHz. For the purpose of determining the number of SAW identification tags 250 that can be accommodated on the illustrated wafer 200, it is assumed that the wafer 200 has SAW identification tags 210 with 2.45 GHz transducers 255 and that an identification number 32 bits long will be encoded. Therefore, the physical dimensions of the tag 250 must accommodate a 2.45 GHz transducer 255, an appropriate number of groups 260 of slots, spaces 265 between the groups 260 and any required framing 270 and/or end 275 reflectors.

Using the foregoing parameters, it can be determined that a minimum SAW identification tag 250 length of about 0.75 mm is appropriate in the instant case. This length can be accommodated on a die 2.0 mm long, which permits 256 die that are 0.5 mm wide and 2.0 mm long to be arranged in an array 210 of 32×8 die. Thus, 4096 SAW identification tags 250 can be made on the illustrated wafer 200 using sixteen arrays 220 arranged in a 4×4 pattern.

Figure 3A:
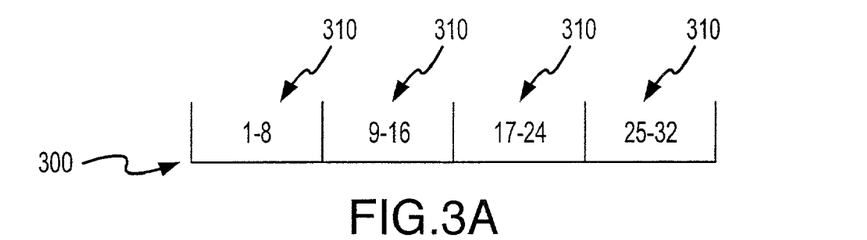
FIGS. 3A–3D illustrates a representative layout of a 32 bit number SAW identification tag of the type illustrated in FIG. 2B where a number that is 32 bits long can be encoded.
Figure 3B:
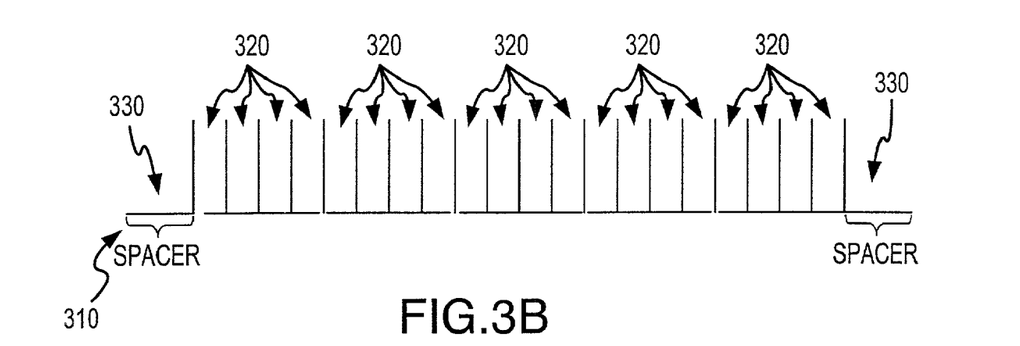
Figure 3C:
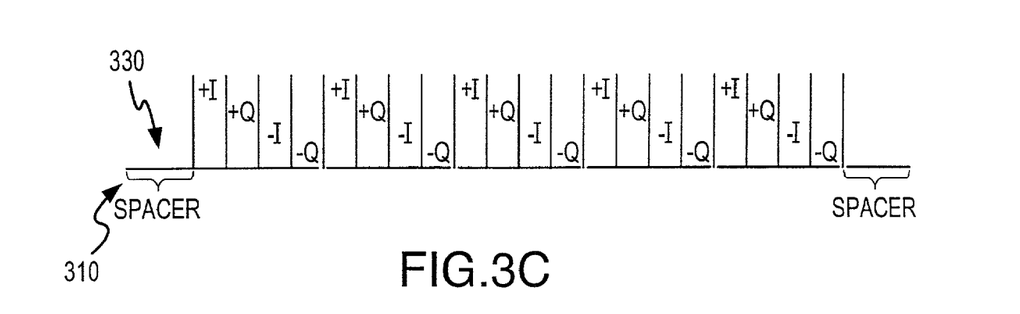
Figure 3D:
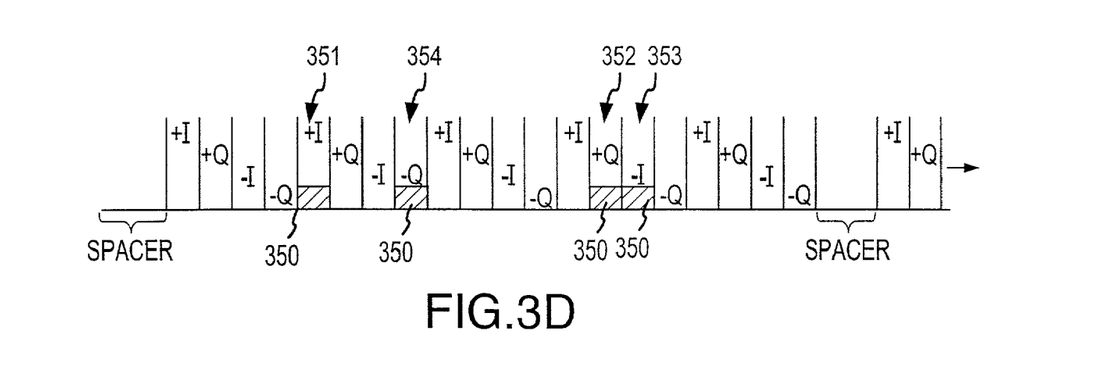

Turning now to FIGS. 3A–3D, illustrated is a representative layout 300 of a 32 bit number SAW identification tag of the type illustrated in FIG. 2B where a number that is 32 bits long can be encoded. FIG. 3A shows the layout of groups 310 of slots showing the bit numbers that will be in each group 310 based on a quadrature encoding formula. FIG. 3B illustrates the first group 310 of eight bit numbers broken down into slots 320 and spacers 330. In FIG. 3C, the slots 320 are labeled showing the quadrature position for each phase of the interrogation signal. FIG. 3D shows the placement of coding reflectors 350 in appropriate slots of the group illustrated in FIG. 3B to encode the hexadecimal number "4B" based on a coding table (not illustrated). To encode this hexadecimal number using quadrature encoding, one encoding reflector 350 is located in a +I slot 351, one in a +Q slot 352, one in a −I slot 353, and one in a −Q slot 354. The same procedure is used to place encoding reflectors 350 in the remaining groups 310 until each encoding reflector 350 is appropriately located. Those of ordinary skill in the pertinent art will understand that similar layouts with different variations of groups 310, slots 320, spacers 330 and encoding reflectors 350 are well within the intended scope of the present invention.

A feature of SAW identification tag of the type to be manufactured using the present invention is that space can be reserved on the surface of the tag for error detection by incorporating additional code regions indicative of "checksum" quantities. This "checksum" feature would represent the summed combination of encoded digits of the number or data encoded on the SAW identification tag in accordance with the checksum logic method being used.

Reticles and masks are used as pattern tools to encode the numbers on the SAW identification tags 250 by locating encoding reflectors 350 for each SAW identification tag 250 in the appropriate location on the wafer 200. A reticle is a tool containing a pattern image that is stepped and repeated using a step-and-repeat-aligner, or stepper, to expose a wafer substrate or to transfer a pattern to a mask. A mask is usually a tool that contains a pattern that can be transferred to an entire wafer or another mask in one exposure. A pattern size can be enlarged up to twenty times than that placed on the wafer 200 or it can be not enlarged at all. In the instant case, for example, a 5× reticle can be used to accommodate a 256 die array 210 with a 32×8 die arrangement. Those of ordinary skill in the pertinent art will understand, of course, that the present invention can be carried with either reticles or masks, or a combination thereof, and be within the intended scope of the present invention.

To encode groups 260 on a wafer 200, there are at least two processes that can be used, as well as any combination of the two or other known or later discovered process. The first is a two-level process where global alignment marks are created, followed by depositing a second layer of resist that will be exposed to reticle or mask image devices (which may involve multiple exposures) followed by an etching process. An "image reversal" mode can also be used to do the patterning by a liftoff process where exposures are used to open desired areas. The second process is also a two-level process where all possible reflectors are patterned at a first level and etched, followed by a second patterning process to protect the coded pattern from a second etching process.

In another embodiment of the invention a programmable stepper is used to locate encoding reflectors 350 in the appropriate positions on a wafer 200. The programmable stepper repetitively exposes a particular pattern in multiple locations across the wafer 200 based on an intentional offset to expose the pattern on the reticle at different locations within the original die layout.

In a particularly useful embodiment of the present invention, the novel use of a one power (or 1×) reticle permits the entire wafer 200 to be encoded using a single reticle. In order to use a single 1× reticle to encode the wafer 200, wafer-dependent indices are established for each wafer 200 to be encoded. This can be done by using a computer programmable stepper, for example. The reticle on the stepper to is used to form, in multiple fields across each of piezoelectric wafer, the wafer-independent patterns of digits of first significance for the SAW identification tags 250 on the wafer 200. The stepper causes the reticle to follow the wafer-dependent indices to form, in multiple fields across each of wafer 200, the wafer-dependent patterns that encode the digits of a second significance or higher for each of the SAW identification tags. In a particularly beneficial embodiment of the invention the programmable stepper can be programmed to cause the reticle to follow a single wafer-dependent index on the wafer to form wafer-dependent patterns.

Figure 4:
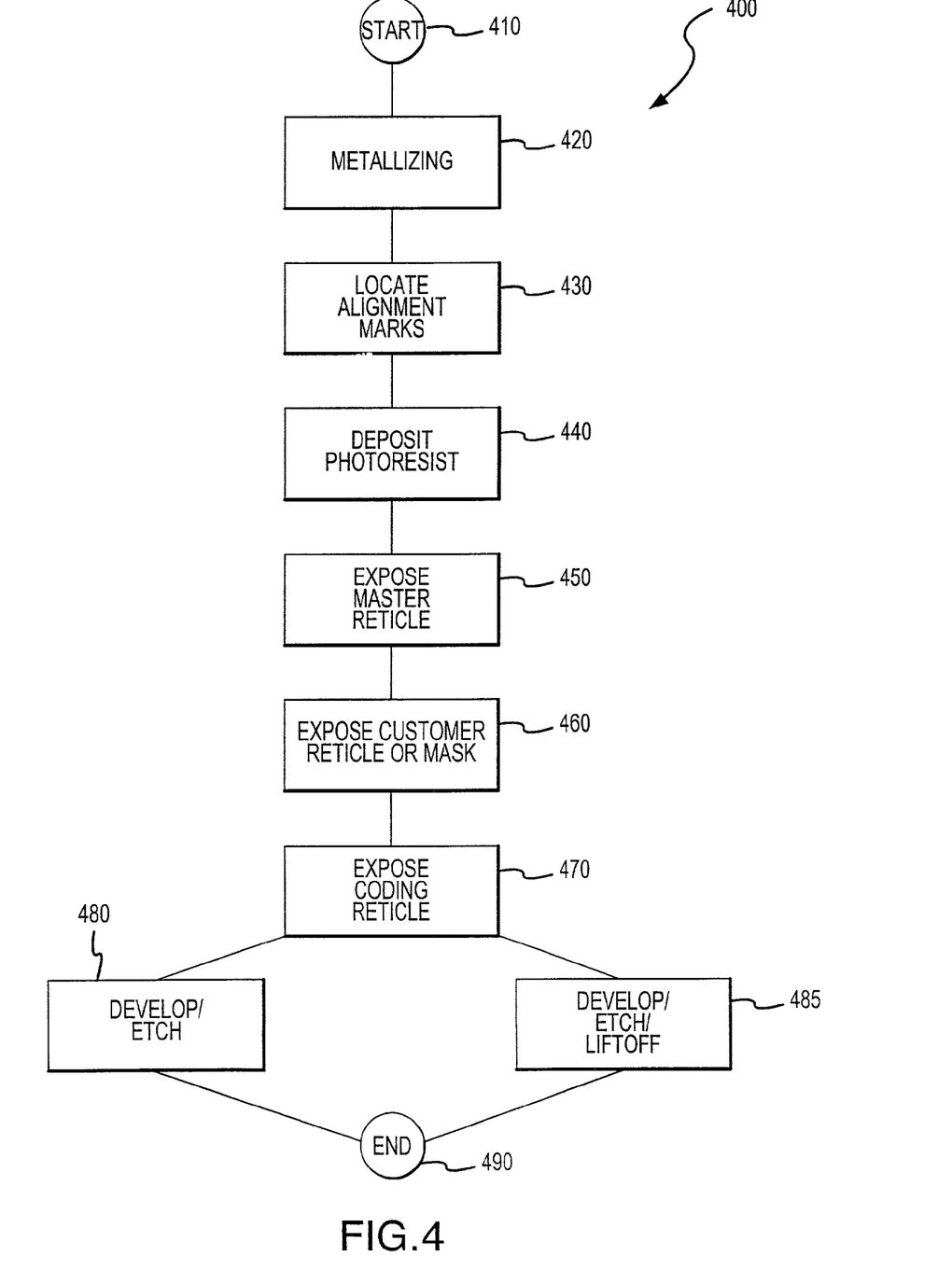
FIG. 4 illustrates a block diagram of one embodiment of a process for manufacturing a wafer using a two-level process whereby global alignment marks are created, followed by depositing a second layer of resist that will be exposed to reticle or mask image devices (which may involve multiple exposures) followed by an etching process.

Turning to FIG. 4, illustrated is a block diagram of one embodiment of a process 400 for manufacturing a wafer using a two-level process whereby global alignment marks are created, followed by depositing a second layer of resist that will be exposed to reticle or mask image devices (which may involve multiple exposures) followed by an etching process. The process 400 commences with a start step 410. In a metallizing step 420, the wafer is first metallized after which, if a stepper is to be used in a step-and-repeat pattern, in a locate alignment marks step 430, zero level global alignment marks are made by a coating, exposing and etching process. In a deposit photoresist step 440, a second photoresist is deposited. In an expose to master reticle step 450 a master reticle is used to expose the photoresist. This master reticle locates all the potential device patterns on the wafer, including, in some embodiments, the lowest significant digits of the number to be encoded thereon. In some embodiments, a "customer coding" reticle or mask can then be used in an expose customer reticle or mask step 460 to expose the photoresist to customer-specific coding. In an expose coding reticle step 470, coding reticles from a library of such reticles are used to expose the photoresist and complete the individualized die coding so that each SAW identification tag has a unique number. Of course those of ordinary skill in the art will understand that individual die coding can also be done with a mask. The combined exposures are then finished in a develop/etch step 480 or in a develop/deposit/liftoff step 485. The process 400 is concluded with an end step 490.

Figure 5:
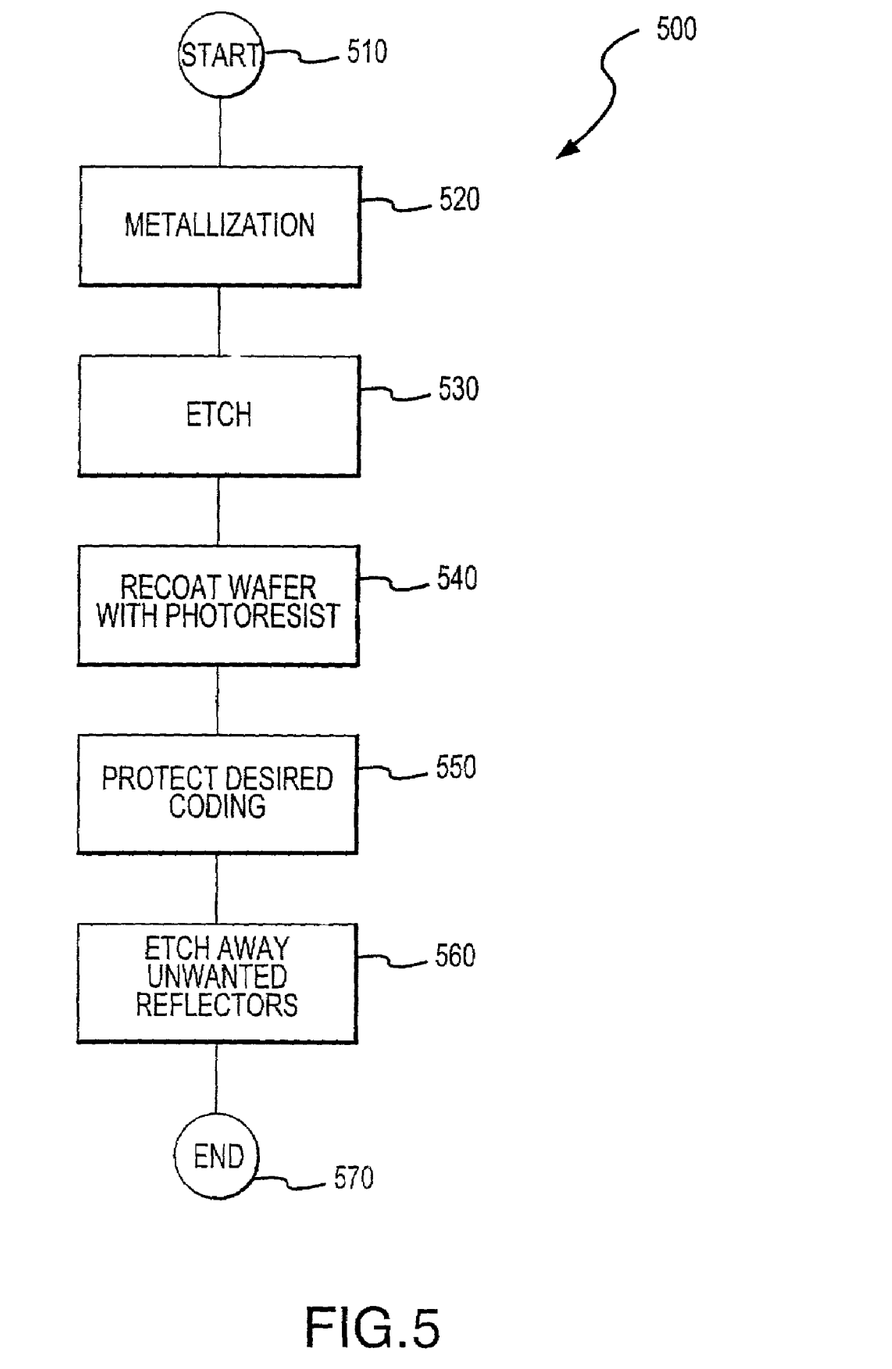
FIG. 5 illustrates a block diagram of a two-level process where all possible reflectors are patterned at a first level and etched, followed by a second patterning process to protect the coded pattern from a second etching process.

Turning to FIG. 5, illustrated is a block diagram of a two-level process 500 where all possible reflectors are patterned at a first level and etched, followed by a second patterning process to protect the coded pattern from a second etching process. The two-level process commences with a start step 510. In a metallization step 520 the wafer is metallized. In an etch step 530 a master reticle or mask is used to etch a pattern into the metal, using a coat/expose/develop process, that will have all potential reflectors present including some digits of a first significance that will remain at the end of the two-level process 500. In a recoat wafer with photoresist step 540, the wafer is recoated with photoresist. In a protect desired coding step 550, different ones of a library of coding reticles are used to protect the desired coding reflectors and other device features to be retained at the end of the two-level process 500. In an etch away unwanted reflectors step 560, unwanted reflectors are etched away. The two-level process 500 concludes with an end step 570.

In some cases it will be more efficient to use a combination of the foregoing two ways to code a wafer. Of course, those of ordinary skill in the pertinent art will understand that any encoding method or system, or combination of methods or systems, used to encode wafers is well within the intended scope of the present invention.

In both of the foregoing processes a master reticle or mask is used to encode devices and coding reflectors for digits of a first significance that will be common to all the SAW identification tags produced from that wafer. This master reticle or mask is wafer-independent because the same reticle or mask can be used on a number of wafers. Of course if the digits of first significance change or the devices on the SAW identification tags are changed, such as changing the transducer to a different frequency, a new wafer-independent reticle or mask will be required. To complete the location of coding reticles, different ones of a library of coding reticles or masks can then be used to form patterns to encode digits of a second significance. Because digits of a second significance are unique to the specific wafer, these patterns are wafer-dependent. Digits of a third or higher significance can be encoded in a similar fashion. In one embodiment, the method provides for at least some of the reflectors to be single strips of conductive metal, which reflectors can be formed using coding reticles as well as the master reticle.

As an example, consider coding the wafer 200 in FIG. 2A to produce SAW identification tags 250 having a number 32 bits long, such as that depicted in FIG. 2B. A master reticle for an array 210 of 256 die (or a master mask for all sixteen arrays 210) can be used to place all the common device features on the wafer 200, such as the transducer and framing and/or end reflectors, as well as any specific user or customer information (such as numbers assigned to a specific customer or industry) that will be common to all the SAW identification tags produced from the wafer 200. In this example, the master reticle or mask will also be individually coded with the two least significant hexadecimal digits from 00 to FF. Coding reticles are then used to uniquely code the next significant digit or digits across the wafer 200 in order, as well as from wafer 200 to wafer 200 and lot to lot. On a wafer 200, such as that depicted, each of the stepped fields of 256 die are coded with the next significant digit by stepping the field sixteen times to create 4096 tags and fully using the third significant hexadecimal digit from "0" to "F." Coding for one wafer 200 of 4096 tags would then start at a code of 0000000 and end with a code of 00000FFF. The next wafer 200 would then start with a code of 00001000 and end with 00001FFF, and so on, with the next wafer 200 in each lot utilizing the next sequential number available.

Although the present invention has been described in detail, those skilled in the art should understand that they can make various changes, substitutions and alterations herein without departing from the spirit and scope of the invention in its broadest form.

The invention claimed is:

1. A method of manufacturing piezoelectric wafers of surface acoustic wave (SAW) identification tags, comprising:

using a master reticle to form, on each of said piezoelectric wafers, wafer-independent patterns that encode digits of the first significance for said SAW identification tags; and using different ones of a library of coding reticles to form, on each of said piezoelectric wafers, wafer-dependent patterns that encode digits of the second significance for said SAW identification tags, said wafer-independent and wafer-dependent patterns composed of reflectors distributed among a group of slots arranged by both pulse position and by phase position, said reflectors encoding said digits of the first significance and said digits of the second significance.

2. The method as recited in claim 1, further comprising forming a SAW transducer on each of said SAW identification tags.

3. The method as recited in claim 1 wherein said reflectors are structures that reflect a surface acoustic wave.

4. The method as recited in claim 3 wherein at least some of said reflectors are single strips of conductive metal.

5. The method as recited in claim 1 further comprising arming a framing reflector on said SAW identification tags, said framing reflector located between said SAW transducer and said group of slots.

6. The method as recited in claim 1 further comprising forming a plurality of said groups separated by dead spaces.

7. The method as recited in claim 6 wherein said plurality of groups is at least twelve.

8. The method as recited in claim 1 further comprising forming an end reflector on said SAW identification tags.

* * * * *